US008981810B1

(12) United States Patent
Trimberger et al.

(10) Patent No.: US 8,981,810 B1
(45) Date of Patent: Mar. 17, 2015

(54) METHOD AND APPARATUS FOR PREVENTING ACCELERATED AGING OF A PHYSICALLY UNCLONABLE FUNCTION

(71) Applicant: Xilinx, Inc., San Jose, CA (US)

(72) Inventors: Stephen M. Trimberger, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/867,574

(22) Filed: Apr. 22, 2013

(51) Int. Cl.
*H03K 19/00* (2006.01)

(52) U.S. Cl.
CPC ...................................... *H03K 19/00* (2013.01)
USPC ...................................... 326/8; 326/9; 326/15

(58) Field of Classification Search
None
See application file for complete search history.

(56) References Cited

U.S. PATENT DOCUMENTS

| 6,313,511 | B1 | 11/2001 | Noguchi |
| 8,290,150 | B2 | 10/2012 | Erhart et al. |
| 2009/0288092 | A1 | 11/2009 | Yamaoka |
| 2011/0191602 | A1 | 8/2011 | Bearden et al. |
| 2011/0196628 | A1 | 8/2011 | Osada |
| 2011/0210798 | A1 | 9/2011 | Koh et al. |
| 2012/0179952 | A1* | 7/2012 | Tuyls et al. .................. 714/768 |
| 2013/0047209 | A1 | 2/2013 | Satoh et al. |
| 2013/0106461 | A1 | 5/2013 | Ficke et al. |
| 2013/0141137 | A1 | 6/2013 | Krutzik et al. |
| 2014/0225639 | A1 | 8/2014 | Guo et al. |

OTHER PUBLICATIONS

U.S. Appl. No. 13/867,429, filed Apr. 22, 2013, Trimberger et al.
U.S. Appl. No. 13/867,456, filed Apr. 22, 2013, Trimberger et al.
Bayon, Pierre et al., "Contactless Electromagnetic Active Attack on Ring Oscillator Based True Random Number Generator," *Proc. of the Third International Workshop on Constructive Side-Channel Analysis and Secure Design (CODADE 2012)*, May 21, 2012, 16 pages.
Handschuh, Helena et al., "Hardware Intrinsic Security from Physically Unclonable Functions," *Towards Hardware-Intrinsic Security*, Nov. 3, 2010, pp. 39-53, Springer-Verlag Berlin, Heidelberg, Germany.
Maes, Roel et al., "Physically Unclonable Functions: a Study on the State of the Art and Future Research Directions," in *Towards Hardware-Intrinsic Security: Foundations and Practice (Information Security and Cryptography)*, Sedeghi et al., Nov. 3, 2010, pp. 1-36, Springer, USA.
Maiti, Abhranil et al., "Improved Ring Oscillator PUF: An FPGA-friendly Secure Primitive," *J, Cryptology*, Oct. 14, 2010, pp. 375-397, vol. 24, No. 2.

(Continued)

*Primary Examiner* — Anh Tran
(74) *Attorney, Agent, or Firm* — Kin-Wah Tong; LeRoy D. Maunu

(57) ABSTRACT

A method, non-transitory computer readable medium, and apparatus for preventing accelerated aging of a physically unclonable function (PUF) circuit are disclosed. For example, the method monitors an environmental condition associated with the physically unclonable function circuit, detects a change in the environmental condition associated with the physically unclonable function circuit, and, in response to the change in the environmental condition, implements a security function for preventing the accelerated aging of the physically unclonable function circuit.

20 Claims, 6 Drawing Sheets

(56) References Cited

OTHER PUBLICATIONS

Meguerdichian, Saro et al., "Device Aging-Based Physically Unclonable Functions," *Proc. of the 48th Annual Design Automation Conference*, Jun. 5, 2011, pp. 288-289, ACM, New York, NY, USA.

Morozov, Sergey, "A Comparative Analysis of Delay Based PUF Implementations on FPGA," *IACR Cryptology ePrint Archive*, Dec. 19, 2009, pp. 1-13, International Association for Cryptologic Research (IACR), <http://www.iacr.org>.

Suh, G. Edward et al., "Physical Unclonable Functions for Device Authentication and Secret Key Generation," *Proc. of the 44th Annual Design Automation Conference*, Jun. 4, 2007, pp. 9-14, ACM, New York, NY, USA.

Virginia Tech, *Background on Physical Unclonable Functions (PIFs)*, downloaded Feb. 15, 2013, pp. 1-3, < http://rijndael.ece.vt.edu/puf/background.html>, Virginia Tech Department of Electrical and Computer Engineering, Blacksburg, Virginia, USA.

Xilinx, *Negative-Bias Temperature Instability (NBTI) Effects in 90 nm PMOS*, WP224 (v1.1), Nov. 21, 2005, pp. 1-4, Xilinx, Inc., San Jose, California, USA.

\* cited by examiner

METHOD AND APPARATUS FOR PREVENTING ACCELERATED AGING OF A PHYSICALLY UNCLONABLE FUNCTION

TECHNICAL FIELD

The present disclosure relates generally to integrated circuits (ICs) and, more particularly, to a method and apparatus for preventing accelerated aging of a physically unclonable function.

BACKGROUND

Physically unclonable functions (PUF) are identifiers on integrated circuits ("chips") that result from process variation. Although these process variations may be undesirable for manufacturing, these process variations create a natural output, a unique "fingerprint" for each chip. By being able to identify a chip, security protocols can be built using the chip's "fingerprint". For example, a PUF allows a user to present a challenge, where the PUF is designed to supply a large number of values.

SUMMARY

The present disclosure provides a method for preventing accelerated aging of a physically unclonable function (PUF) circuit. For example, the method can comprise: monitoring, by a processor, an environmental condition associated with the physically unclonable function circuit; detecting, by the processor, a change in the environmental condition associated with the physically unclonable function circuit; and implementing, by the processor and in response to the change in the environmental condition, a security function for preventing the accelerated aging of the physically unclonable function circuit.

In various embodiments, one or more of the following may be true: the environmental condition comprises an operating voltage of the physically unclonable function circuit; the environmental condition comprises an operating temperature of the physically unclonable function circuit; the environmental condition comprises a time period in which the physically unclonable function circuit is accessed; the security function comprises deactivating the physically unclonable function circuit; the security function comprises activating the physically unclonable function circuit for a shorter period of time; the security function comprises modifying a challenge of the physically unclonable function circuit; the security function comprises limiting access to inputs of the physically unclonable function circuit; the security function comprises modifying a number of challenges of the physically unclonable function circuit; the security function comprises applying a uniform aging on each path of the physically unclonable function circuit; the security function comprises receiving an authentication before providing access to the physically unclonable function circuit; the authentication comprises a password; and/or the security function comprises controlling a time duration that the physically unclonable function circuit is active.

The present disclosure provides another method for preventing accelerated aging of a physically unclonable function (PUF) circuit. For example, the method can comprise: monitoring, by a processor, a physically unclonable function parameter associated with the physically unclonable function circuit; detecting, by the processor, a change in the physically unclonable function parameter associated with the physically unclonable function circuit; and implementing, by the processor and in response to the change in the physically unclonable function parameter, a security function for preventing the accelerated aging of the physically unclonable function circuit.

In various embodiments, one or more of the following may be true: the physically unclonable function parameter comprises a signature of the physically unclonable function circuit; the signature is formulated from a natural frequency of the physically unclonable function circuit; the signature is formulated from an energy requirement of the physically unclonable function circuit; the energy requirement of the physically unclonable function circuit comprises at least one of: a power requirement, a voltage requirement, or a current requirement; the security function comprises deactivating the physically unclonable function circuit; and/or the security function comprises activating the physically unclonable function circuit for a shorter period of time.

BRIEF DESCRIPTION OF THE DRAWINGS

Accompanying drawings show exemplary circuits and methods in accordance with one or more aspects of the invention. However, the accompanying drawings should not be taken to limit the invention to the examples shown, but are for explanation and understanding only.

FIG. 3 illustrates an example flowchart of a method for performing physically unclonable function burn-in;

To facilitate understanding, identical reference numerals have been used, where possible, to designate identical elements that are common to the figures.

DETAILED DESCRIPTION

The present disclosure broadly discloses a method, non-transitory computer readable medium, and apparatus for preventing accelerated aging of physically unclonable function. As discussed above, each integrated circuit chip can have a unique "fingerprint". By being able to identify a chip, security protocols can be built using the chip's "fingerprint". However, a PUF can be attacked, e.g., via accelerated aging. Accelerated aging (broadly, stressing one or more circuits, one or more transistors, one or more wires and the like) can be applied to a PUF such that an adversary may predict or set a PUF value, thereby defeating the security challenge. Before describing various methods of preventing such accelerated aging, the present disclosure describes one or more methods of PUF accelerated aging to demonstrate such PUF accelerated aging techniques. However, these examples are only illustrative, and other PUF accelerated aging techniques can be addressed by the methods and apparatus as discussed further below.

One accelerated aging technique comprises a method for performing physically unclonable function burn-in. For example, the components within the integrated circuit (e.g., transistors, individual circuit paths, etc.) of a semiconductor chip (e.g., a memory chip, a complementary metal-oxide semiconductor (CMOS) chip, and the like) are intentionally aged such that the "fingerprint" is burned in. In other words, a physical characteristic of the integrated circuit is exploited to ensure that a natural output of the integrated circuit is repeated. For example, a "weaker" portion of the semiconductor chip is intentionally aged to further "weaken" this portion of the semiconductor chip to ensure that a natural output is burned-in.

This may be repeated for each integrated circuit representing a bit of the semiconductor chip to ensure that the natural output of the semiconductor chip is ensured. For example, a memory may have four bits that have natural output values of 1010 before the memory cell is initialized. The integrated circuit associated with each one of the four bits is intentionally aged to ensure that the memory will always output the value of 1010.

The approach of intentional aging may be further extended such that a semiconductor chip is forced to store any desired value. For example, a semiconductor chip is intentionally aged to become a non-volatile memory using the aging process.

Figure 1:
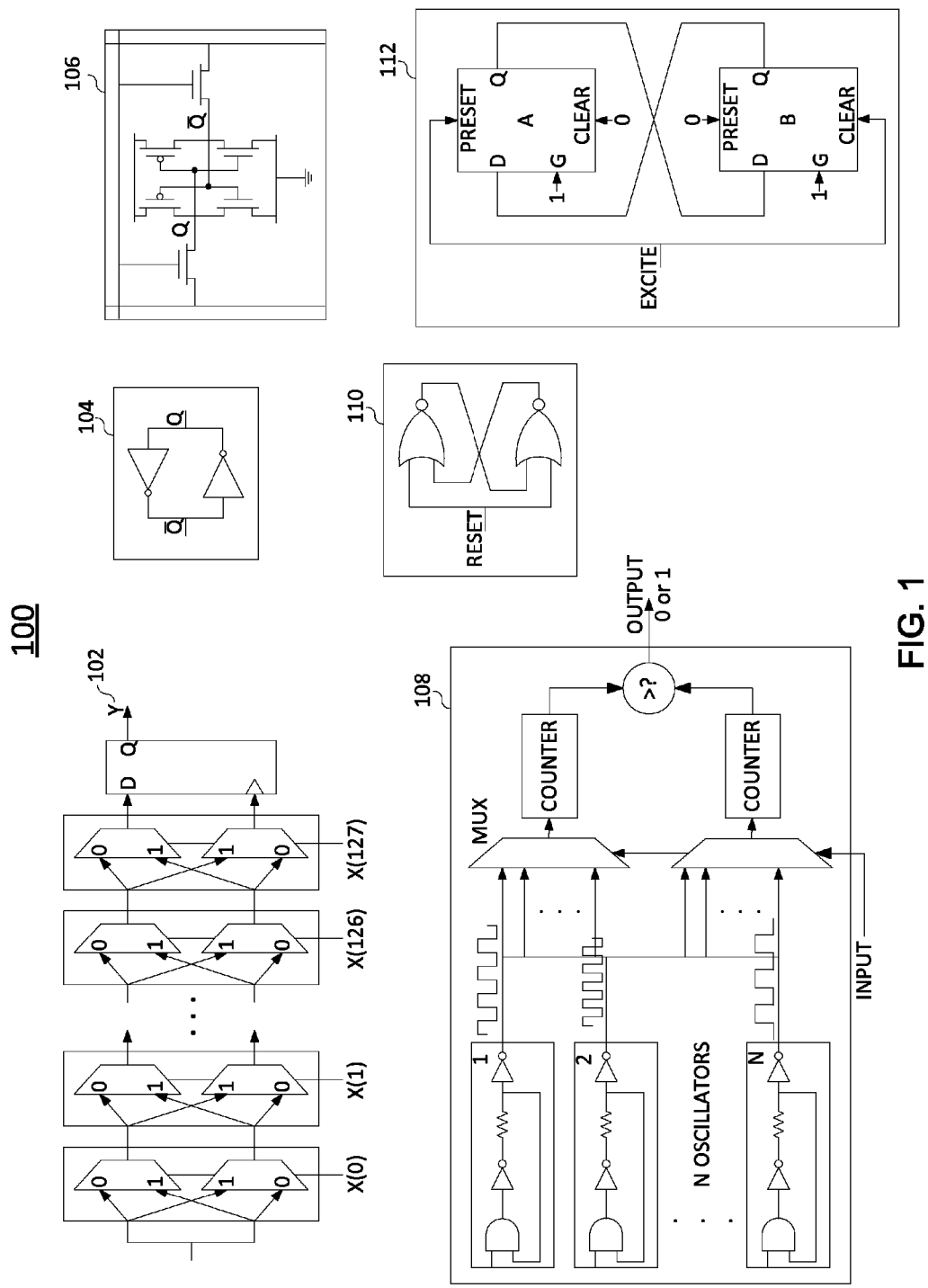
FIG. 1 illustrates examples of integrated circuits that have physically unclonable functions (PUFs)

FIG. 1 illustrates examples of different types of integrated circuits that have PUFs. The integrated circuit may comprise an arbiter circuit 102. The arbiter circuit 102 takes as input two delay paths and produces an output based on which path is faster.

The integrated circuit may comprise a static random access memory (SRAM) 106. FIG. 1 also illustrates a logical circuit 104 of the SRAM 106. The integrated circuit may comprise a ring oscillator based circuit 108, a latch cell 110, a butterfly cell 112, and the like. In the PUF design, identical components are constructed to be identical in design, hence differing by manufacturing process variation. Although several examples of integrated circuits that can be used as PUFs are illustrated in FIG. 1, it should be noted that an aging process may be applied to any type of integrated circuit or semiconductor chip.

As discussed above, any one of the integrated circuits illustrated in FIG. 1 may be aged to burn in a natural output of the integrated circuit. A natural output is a signal generated by the integrated circuit when unbiased by noise or external signals. A memory may store a natural value when it is powered-up, but not written to any specific value. An oscillator may have a natural frequency of oscillation. Each one of the integrated circuits illustrated in FIG. 1 may have different physical characteristics associated with the PUF of that integrated circuit that is aged. For example, the arbiter delay circuit 102 has a physical characteristic of delay in each of the paths that is exploited to age the integrated circuit. In another example, the SRAM 106 has a physical characteristic of one or more transistors used to store a value that is exploited to age the integrated circuit. In another example, the ring oscillator based circuit 108 has a physical characteristic of a frequency that is exploited to age the integrated circuit.

Various aging effects may be applied to the physical characteristic of the integrated circuit to age or change the physical characteristic. For example, negative bias temperature instability (NBTI) may be applied. NBTI provides prolonged negative bias on transistors that may cause a threshold voltage to shift. NBTI may be used to affect P-channel transistors.

In another example, positive bias temperature instability (PBTI) may be applied. PBTI provides prolonged positive bias on transistors that may cause a threshold voltage to shift. PBTI may be used to affect N-channel transistors.

In yet another example, hot carrier injection (HCI) may be applied. In HCI, a charge is trapped in the gate region of a transistor, thereby changing the effective threshold.

In yet another example, electromigration may be applied. In electromigration, high current through metal lines causes them to thin, thereby, increasing resistance. Although four aging effects are described above, it should be noted that any aging effect may be applied that can be used to manipulate or emphasize a physical characteristic of the integrated circuit. The aging mechanism may not be the same mechanism that causes variation that produces the natural output of the integrated circuit.

The aging effect may be applied for a time period sufficient to manipulate or emphasize the physical characteristic of the integrated circuit until the natural outcome is burned into the integrated circuit. For example, the aging effect is applied to the integrated circuit for approximately one minute or more.

The amount of time the aging effect is applied may be a function of environmental parameters, e.g., a voltage and/or a temperature. For example, the aging effect is accelerated if the voltage is increased or if the temperature is increased.

Figure 2:
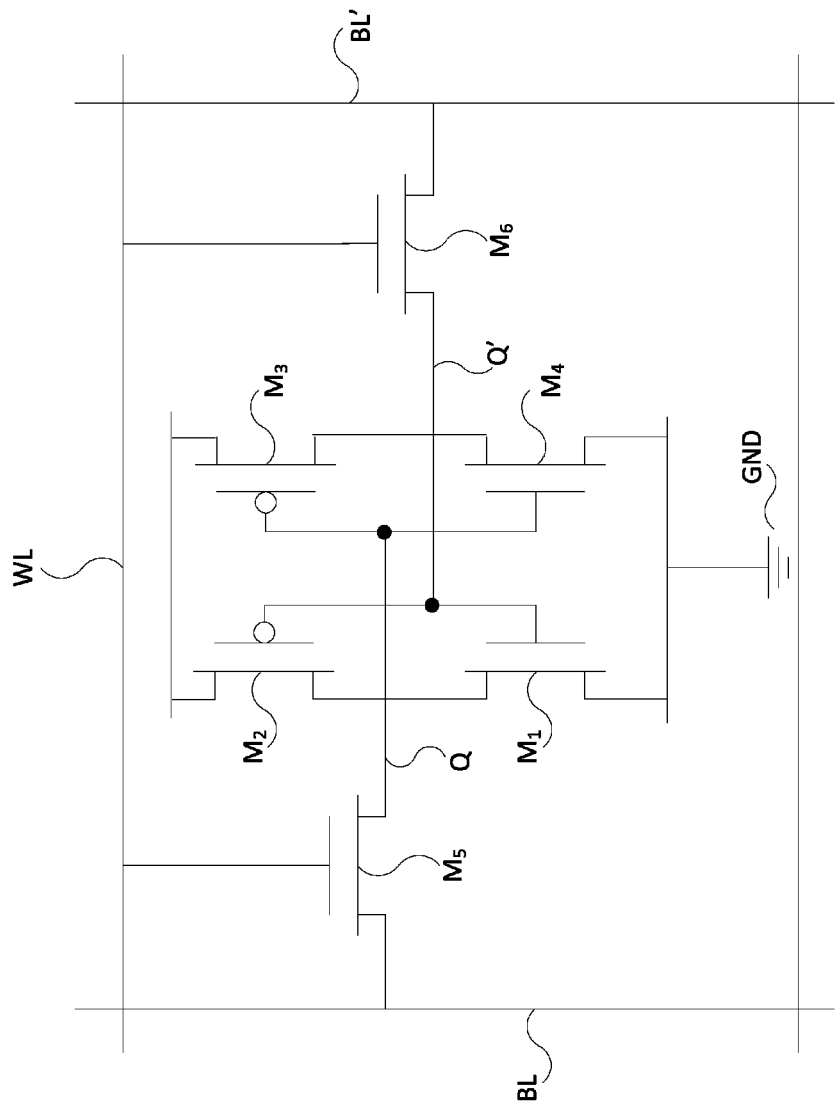
FIG. 2 illustrates one example of a static random access memory (SRAM) PUF.

FIG. 2 illustrates a more detailed view of the SRAM 106 to provide a more detailed explanation of one example of how an integrated circuit is intentionally aged. The SRAM 106 includes bit lines BL' and BL and a word line WL. The SRAM 106 includes stored values Q' and Q. The SRAM 106 includes transistors $M_1$-$M_6$. Some of the transistors, e.g., $M_1$ and $M_4$, are referred to as pull down transistors and some of the transistors, e.g., $M_2$ and $M_3$, are referred to as pull up transistors.

Ideally, the pullup transistors $M_2$ and $M_3$ should be identical P-channel devices and pulldown transistors $M_1$ and $M_4$ should be identical N-channel devices. Access transistors $M_5$ and $M_6$ should also be identical and the layout of the memory cell should balance capacitances on the Q ad Q' nodes. However, in actuality each transistor $M_1$-$M_6$ varies slightly due to uncontrollable factors during the manufacturing process, such as for example, dopant concentrations. Variations in the relative threshold voltages of the transistors $M_1$-$M_6$ cause each cell to tend toward a natural value of 1 or 0 when power is applied initially. The more closely matched the threshold voltages are, the more influence noise or external signals will have over the natural output, possibly causing the bit of the SRAM 106 to flip. By aging the "weaker" transistors, the threshold voltage is moved in a desired direction to guarantee that the natural output is maintained over time. In other words, intentionally aging the "weaker" transistors ensure that the bit of the SRAM 106 will not flip due to noise or external signals over time.

Before the SRAM 106 is initialized, a natural output of the SRAM 106 is read. For example, the SRAM 106 may have a natural output of Q=0. Thus, by aging the SRAM 106 the natural output of Q=0 can be reinforced. In one example, the SRAM 106 is aged by setting the value of Q to Q=1. This can be performed by writing a 1 into the memory cell by asserting the word line WL high with BL=1 and BL'=0, thus, setting Q=1 and Q'=0. WL is then reset to WL=0 if desired. Q=1 turns on pulldown transistor $M_4$ and turns off pullup transistor $M_3$. Q'=0 turns off pulldown transistor $M_1$ and turns on pullup transistor $M_2$. By activating transistors $M_2$ and $M_4$ and allowing current to flow through them, the transistors $M_2$ and $M_4$ are weakened to ensure that the natural output of Q=0 is always the output Q. In another aging process, holding the value of Q'=0 on the gate of transistor $M_2$ causes NBTI aging regardless of current and weakening of the transistor $M_2$. In other words, the threshold voltage for $M_2$ is increased using the aging effects such that random variations or noise or external signals will not bring about the threshold voltage for Q=1 and cause the bit of the SRAM 106 to flip to 1 from a natural output of Q=0.

The aging may be performed using any of the aging effects described above, e.g., NBTI, PBTI, HCI or electromigration. The aging effect is applied, for example, for at least one minute. The aging effect can be accelerated (i.e., decreasing an amount of time required to age the transistors) by increasing the voltage or temperature.

Although the SRAM 106 is provided as an example, it should be noted that any of the integrated circuits illustrated in FIG. 1 may be aged in a similar fashion or different fashion. For example, electromigration is applied to selected paths in the arbiter delay circuit 102 to thin the metal lines, thereby increasing resistance and increasing the delay to ensure that the fastest path is always selected. For example, HCI can be used in a clock latch transistor to slow future transitions that bias the result in favor of a particular clock path for the latch cell 110. For example, a multiplexer is stressed to make the multiplexer slower and make the multiplexer lose its edges such that a counter shows a lower value and the output of a comparator will always show a particular path for the ring oscillator based circuit 108.

As noted above, the aging may be repeated for each integrated circuit associated with each bit of the semiconductor chip. Thus, the PUF of the semiconductor chip may be intentionally burned into the chip such that the natural output can be guaranteed and no helper data is required. This allows the PUF to be used for decryption without adding to memory overhead required by the methods that use helper data.

In addition, the methods of aging to burn in a PUF to the semiconductor chip may be extended to allow a user to store any value. For example, rather than burning in the natural output of each integrated circuit for the semiconductor chip, a user may desire to store an alternative value. The alternative value is set using the aging process described herein to create a non-volatile memory.

Figure 3:
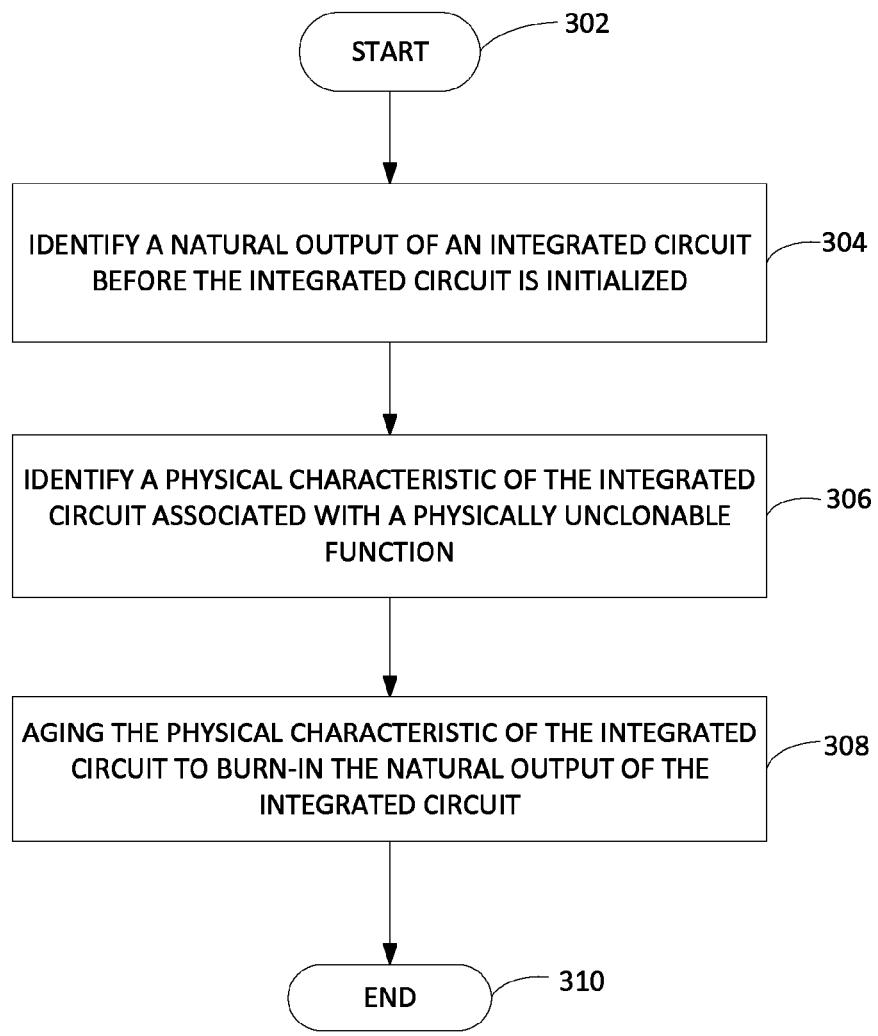
Figure 5:
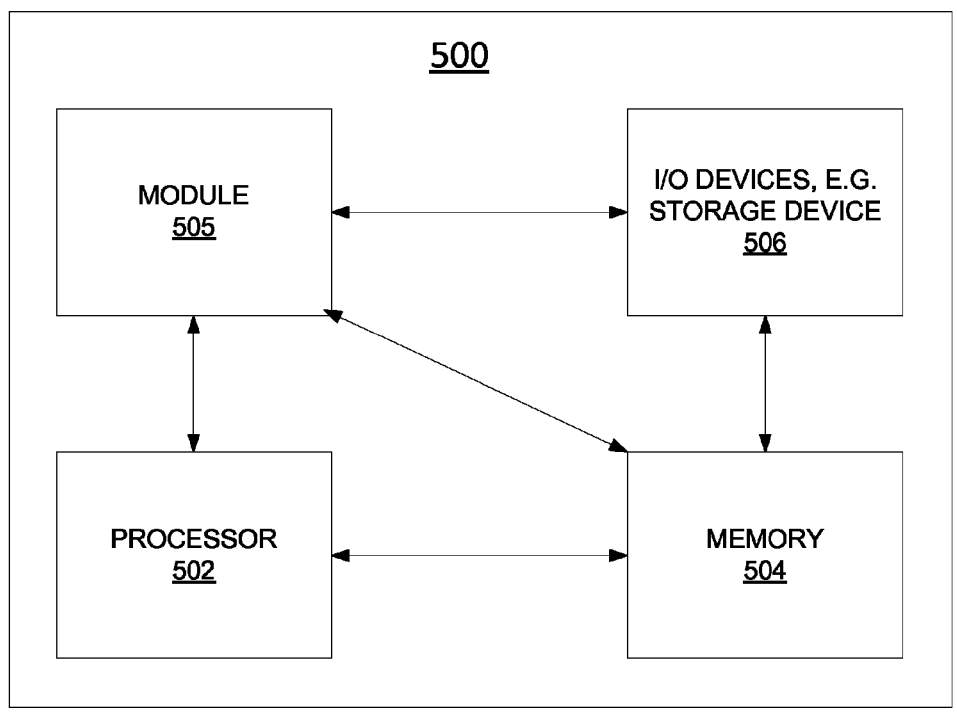
FIG. 5 illustrates a high-level block diagram of a general-purpose computer suitable for use in performing the functions described herein.

FIG. 3 illustrates a flowchart of a method 300 for performing physically unclonable function burn-in. The method 300 may be performed by a general purpose computer as illustrated in FIG. 5 and discussed below.

The method 300 begins at step 302. At step 304, the method 300 identifies a natural output of an integrated circuit before the integrated circuit is initialized. As noted above, when semiconductor chips are manufactured, the process variation created during the manufacturing creates a unique "fingerprint" for each semiconductor chip. This natural "fingerprint" may also be referred to as a physically unclonable function (PUF).

Before the semiconductor chip is initialized, each integrated circuit within the semiconductor chip may have a natural output. For example, each integrated circuit within the semiconductor chip is read before it is initialized to identify what the natural output is. For example, each integrated circuit is read to determine if it naturally stores a value of 1 or a value of 0.

At step 306, the method 300 identifies a physical characteristic of the integrated circuit associated with a PUF. For example, different types of integrated circuits have different types of physical characteristics that can be exploited to ensure the natural output is constant. In other words, each integrated circuit has a different physical characteristic that contributes towards the PUF.

For example, an arbiter delay circuit has a physical characteristic of delay in each of the paths that is exploited to age the integrated circuit. In another example, an SRAM has a physical characteristic of one or more transistors used to store a value that is exploited to age the integrated circuit. In another example, a ring oscillator based circuit has a physical characteristic of a frequency that is exploited to age the integrated circuit, and so forth.

At step 308, the method 300 ages the physical characteristic of the integrated circuit to burn-in the natural output of the integrated circuit. For example, if the integrated circuit has a particular "weak" physical characteristic that leads to producing the natural output, then the particular "weak" physical characteristic is further "weakened" to ensure that the integrated circuit always has the same natural output.

One example of aging is discussed above with respect to an SRAM in FIG. 2. For example, the physical characteristic of the SRAM may be the transistors and how they operate to arrive at the natural output value of 0. As illustrated in FIG. 2 and discussed above, various transistors within the SRAM are aged such that the threshold voltage of those transistors are increased to ensure that the integrated circuit does not flip to a value of 1 due to random variations or noise within the circuit or external signals.

Once the integrated circuit is aged, the PUF is burned into the integrated circuit to ensure that the natural output does not change. The aging process may be extended to any integrated circuit to store any value (e.g., outputs other than the natural output). In other words, any semiconductor chip is transformed into a non-volatile memory by using the aging process to force the semiconductor chip to always store a desired value or output.

The method 300 (e.g., steps 304, 306 and 308) may be repeated for each integrated circuit associated with a bit in the semiconductor chip. For example, if the semiconductor chip is SRAM with 16 bits, the method 300 may be repeated for each one of the integrated circuits associated with each one of the 16 bits. Thus, the PUF will be burned in for the SRAM such that the natural output of each bit of the SRAM remains constant over a lifespan of the SRAM. The method 300 ends at step 310.

If an adversary or attacker can stress some part of the PUF, then that part of the PUF will age faster, i.e., slowing that part of the PUF down. This will affect the resulting value of the PUF when it is queried. For example, referring to arbiter 102 in FIG. 1, if an adversary can force and hold a "1" on the inputs on the left, then in the latch, when both the D and the clock of the latch are "1", hot carriers can be injected into the clock latch transistor, thereby slowing future transitions. This, in turn, bias the result in favor of the data path. This aging works in latches built of cross-coupled gates 110, such as shown in FIG. 1, where the reset is broken out into separate inputs for the arbiter PUF case.

In another example, referring to 108 of FIG. 1, an adversary can stress specific mux inputs if the adversary can provide each mux with a different selection. The adversary can pre-stress the lower or bottom mux, for example, so that is much slower than the top or upper mux, perhaps causing the lower mux to lose edges. The counter will show a lower value. Thus, the adversary can ensure that the output of the comparison will show the bottom path being slower for those mux inputs. Thus, an adversary can dial in the speed of each mux leg, thereby generating a known PUF value for every challenge.

In yet another example, referring to 106 of FIG. 1, if the memory cell is holding a Q=0, the top left and bottom right transistors of the cross-coupled inverters are conducting, such that those paths are aging. Over a period of time, the cell will become less likely to come up with Q=0. If an adversary can load a memory that is to be used as a PUF, and hold the value, the adversary can bias the resulting PUF value. Furthermore, if an adversary can force the cell to read, depending on the specific implementation of the sense amplifier of the SRAM, the left side, Qbar (Q) signal will probably be conducting and aging as well, further aging the left side transistors due to a larger current. SRAM PUFs might be built using SRAMs in the chip that a user can access (such as look-up table (LUT) RAM. If an adversary loads all zeros into the LUT RAM, the ON transistors in the RAM cell will begin to age. NBTI and PBTI are accelerated by constant-direction current, which is precisely the situation when an SRAM has a constant value. Hot-carrier injection can slow the ON transistors in the SRAM. By setting the value of the SRAM that will be used in the future to generate a PUF, the adversary can bias the memory cells.

Figure 4:
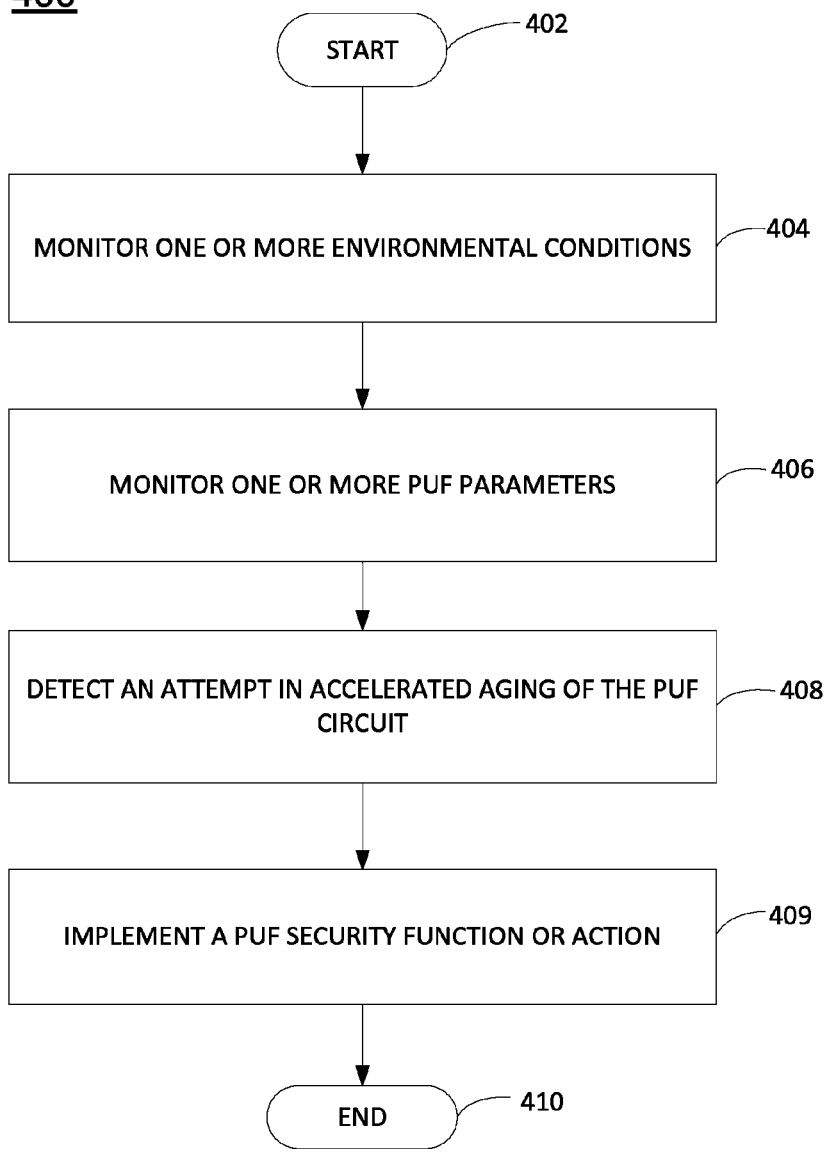
FIG. 4 illustrates an example flowchart of a method for preventing accelerated aging of physically unclonable function.

To address the numerous examples of accelerated aging, the present disclosure describes a number of methods for preventing accelerated aging of physically unclonable functions. These methods for preventing accelerated aging of physically unclonable functions are broadly disclosed with reference to FIG. 4. It should be noted that one or more steps, blocks, or operations of FIG. 4 can be deemed to be optional depending on each specific method or implementation. After FIG. 4 is broadly described, each method is then discussed in further detail. The method 400 may be performed by a general purpose computer as illustrated in FIG. 5 and discussed below.

The method 400 begins at step 402. At step 404, the method 400 monitors one or more environmental conditions related to a PUF, e.g., measuring, recording and/or comparing one or more environmental conditions. Environmental conditions may broadly comprise a temperature level, a control voltage level, a power supply level, a radiation level, an electric field level, a magnetic field level, a radio frequency (RF) field level, a level of single event upset occurrences, and the like. It should be noted that this list of environmental conditions is only illustrative and is not exhaustive.

At step 406, the method monitors one or more PUF parameters, e.g., measuring, recording and/or comparing one or more PUF parameters. PUF parameters may broadly comprise a signature of a PUF circuit (e.g., the signature can be formulated from a natural frequency of a ring oscillator, an energy requirement of the PUF circuit (e.g., a power, current or voltage requirement of a ring oscillator)), a band of frequencies used by a ring oscillator, and the like. It should be noted that this list of PUF parameters is only illustrative and is not exhaustive.

At step 408, the method detects an attempt in accelerated aging of the PUF circuit. For example, the monitored one or more environmental conditions and/or the monitored one or more PUF parameters indicate that an attempt at accelerated aging of the PUF circuit is in progress, e.g., a change or a difference in the monitored one or more environmental conditions and/or the monitored one or more PUF parameters as compared to a stored predefined threshold or range as discussed below.

At step 409, the method implements, applies or executes one or more PUF security functions or actions. PUF security functions or actions may broadly comprise controlling a voltage supplied to a PUF circuit, deactivating a PUF circuit, activating a PUF circuit for a shorter period of time, modifying a challenge of a PUF circuit, limiting access to inputs of a PUF circuit, modifying the number of challenges of a PUF circuit, implementing a uniform aging method on each path of the PUF circuit, presenting an authorization method or process before accepting a challenge, controlling the time that a PUF circuit is active, and the like. It should be noted that this list of PUF security functions or actions is only illustrative and is not exhaustive. Method 400 ends in step 410.

It should be noted that although not explicitly specified, one or more steps or operations of the method 400 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks or operations in FIG. 4 that recite a determining operation, or involve a decision, do not necessarily require that both branches of the determining operation be practiced. In other words, one of the branches of the determining operation can be deemed as an optional step.

In one method, improper environmental conditions are prevented. For example, a voltage sensor and/or a temperature sensor are employed to monitor a supply voltage that is provided to a PUF circuit and the operating temperature of the PUF circuit. In another method, referring to FIG. 6, the supply voltage to the PUF circuit 640 is regulated by a voltage regulator 630 on the chip and is not subject to external control. In one example, the PUF circuit includes heating elements, which may be built as oscillators, and the PUF circuit is only activated when the temperature sensor indicates the temperature is at an acceptable value. As discussed above, high supply voltage and high temperature can accelerate the aging of a PUF circuit. To address this potential threat, the method measures the operating voltage and/or the operating temperature (both broadly referred to as environmental conditions) of a PUF circuit. Respective operating range for the operating voltage and/or the operating temperature can be predefined for the PUF circuit. If the monitored operating voltage and/or the operating temperature are detected outside of the predefined ranges, then the PUF circuit will be deactivated (broadly a PUF security function or action). Another environmental condition may comprise a time period in which a PUF circuit is accessed. For example, if a PUF circuit is activated greater than a predefined amount of time, then the PUF circuit will be deactivated for a period of time. The reason is that an adversary may be attacking the PUF circuit by applying an accelerated aging technique to the PUF circuit over an extended period of time. By detecting such extended period of time, the method can deactivate the PUF circuit, thereby interrupting the attack on the PUF circuit.

In an alternate method, unauthorized access to a PUF circuit is prevented or limited. For example, an authentication module (broadly a PUF security function or action) can be deployed for accessing the PUF circuit, e.g., a user has to provide a password before access to the PUF circuit is provided to the user. An another example, control inputs to a PUF circuit are configured such that the control inputs are not capable of being accessed externally (broadly a PUF security function or action). For example, the cells of a SRAM PUF circuit cannot be accessed externally to have values written into the cells of the SRAM PUF circuit. Similarly, the mux values of an arbiter PUF circuit cannot be accessed. A variant of this method includes limiting the application of the interrogation pattern that is sent to the PUF circuit. In other words, the frequency of allowing a user to apply the interrogation pattern to the control inputs of the PUF circuit can be intentionally limited to a long period of time (broadly a PUF security function or action), e.g., one interrogation per minute, one interrogation per five minutes, and so on. Frequent application of the interrogation pattern can also be used as an accelerated aging technique. Thus, access to the control inputs can be limited but not completely prevented.

Figure 6:
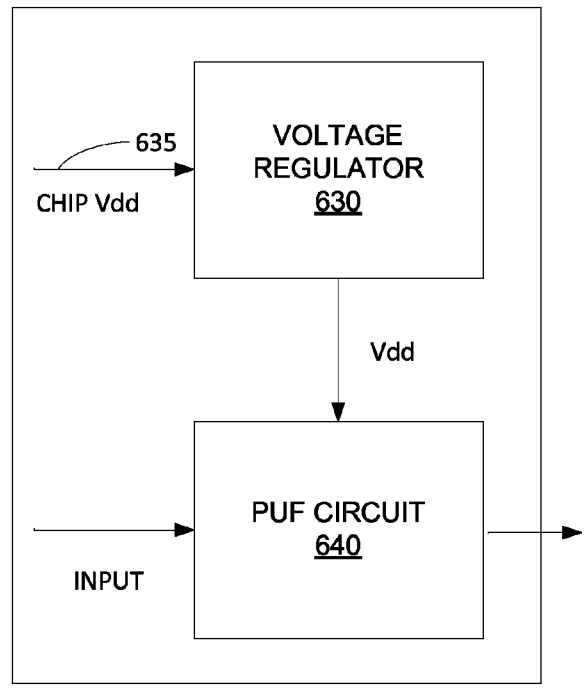
FIG. 6 illustrates several examples of PUF circuits with additional circuits or modules.
Figure 6:
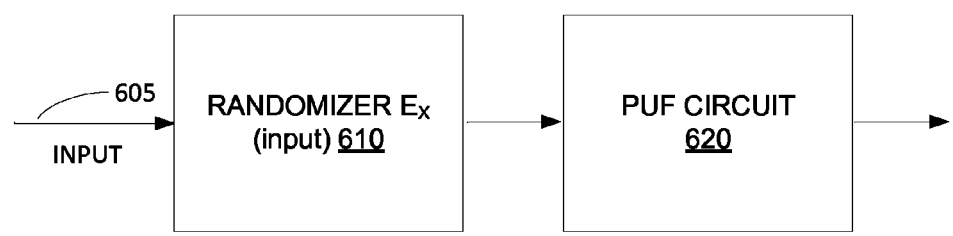

In an alternate method, an adversary cannot control values of a challenge on a PUF circuit. A challenge or interrogation pattern to a PUF circuit is randomized. For example, a pseudo-randomizer, e.g., a module for applying a hash function can be deployed to randomize a challenge or interrogation pattern. In other words, the method places the challenge through a one-way hash function for encrypting the challenge before it is sent to the PUF circuit. FIG. 6 shows an example of a randomizer deployed for receiving a PUF query (broadly, an input). The user's PUF challenge or stimulus 605 is presented to randomizer 610, which may be an encryptor, encrypting the input. The output of the randomizer is presented as the actual challenge to the PUF circuit 620.

In an alternate method, an attack on a PUF circuit is made impractical due to an extended period of the time for the attack to be completed, i.e., making the attack to take too long. For example, a time extension mechanism (broadly a PUF security function or action) may comprise having a very large number of challenges or interrogation patterns for a PUF circuit (e.g., having $2^{128}$ number of challenges or interrogation patterns for a PUF circuit), extending the time that each individual challenge is completed (e.g., taking 30 seconds before a reply is presented in response to a challenges or interrogation pattern), and the like. This will cause an adversary a very long period of time, e.g., a number of years, to enumerate all possible challenges and set their values with aging.

In an alternate method, balanced aging (broadly a PUF security function or action) is applied to a PUF circuit. For example, cells of a SRAM PUF can be alternately written with a value "0" and "1" uniformly over a period of time. In other words, the value of "0" can be stored for five minutes followed by the value of "1" being stored for five minutes, then repeating the sequence again. In another example, for an arbiter PUF circuit, each leg of the mux can be activated the same amount of time. Thus, after a PUF circuit is activated, an aging pattern is applied that will age all paths of the PUF circuit in the same way.

A ring oscillator PUF circuit can be influenced by modulating the power supply to the ring oscillator PUF circuit or by directly injecting a synchronizing signal to cause a change to the frequency of the ring oscillator PUF circuit. Furthermore, the ring oscillator PUF circuit can be influenced by having small electric field or magnetic field being applied in proximity for inducing currents and/or voltage in the interconnecting wiring of the ring oscillator PUF circuit to force synchronization. For example, a printed circuit board is used as the antenna elements and the antennas may be located directly above the ring oscillator PUF circuit to be controlled.

In one alternate method, the method monitors one or more PUF parameters. For example, various sensors (e.g., power supply sensors, current sensors, voltage sensors, timers, receiver circuits, and the like) are deployed to monitor one or more PUF parameters, e.g., measuring, recording and/or comparing one or more PUF parameters.

More specifically, a natural frequency and/or other energy requirements (e.g., current level, voltage level, power level) of a ring oscillator PUF circuit is measured and stored. One or more of the natural frequency and/or other energy requirements of the ring oscillator PUF circuit can be viewed as a unique signature of a particular ring oscillator PUF circuit. When the oscillator is forced to oscillate at frequencies not its natural frequency, it will require more energy. The detection of a difference from its natural frequency and/or other energy requirements (broadly a difference from its signature) will indicate that the ring oscillator PUF circuit is being aged in an accelerated manner. For example, it is observed that pulling an oscillator to a different frequency takes a certain number of cycles, such that the start-up of the influenced oscillator is different in terms of frequency vs. time when compared to an oscillator that is not being influenced. Another detection method is to employ sensitive receiver circuit that is tuned to a band of frequencies that is used by the ring oscillator PUF circuit for detecting external electric, magnetic, or RF fields. Once an attack on the ring oscillator PUF circuit is detected, one or more PUF security functions or actions can be employed, e.g., deactivating the ring oscillator PUF circuit, limiting the time that the ring oscillator PUF circuit is activated, extending the time period for returning a response when a challenge is presented on the ring oscillator PUF circuit and so on.

Finally, a plurality of different methods for preventing accelerated aging of a PUF circuit has been described. It should be noted that various operations as described in each respect method can be implemented by themselves or in conjunction with other operations of one or more other methods as described above. In other words, the operations of these described methods can be interchanged to form modified methods for preventing accelerated aging of a PUF circuit.

FIG. 5 depicts a high-level block diagram of a general-purpose computer suitable for use in performing the functions described herein. As depicted in FIG. 5, the system 500 comprises a hardware processor element 502 (e.g., a CPU), a memory 504, e.g., random access memory (RAM) and/or read only memory (ROM), a module 505 for preventing accelerated aging of physically unclonable function, and various input/output devices 506, e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like).

Other forms of hardware processors may be used, such as for example, a state machine. In some examples, the processor may reside on the same semiconductor chip as the PUF. In other examples, the processor resides outside the semiconductor chip containing the PUF.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or operations of the above disclosed method. In other words, these methods can be implemented in a combination of software and hardware, e.g., using application specific integrated circuits (ASIC), a programmable IC such as a Field Programmable Gate Array (FPGA), a general purpose computer, or any other hardware equivalents such as microprocessors. The present module or process 505 for preventing accelerated aging of physically unclonable function can be loaded into memory 504 and executed by hardware processor 502 to implement the functions as discussed above. As such, the exemplary methods (including associated data structures) of the present disclosure can be stored on a non-transitory (e.g., tangible or physical) computer readable storage medium, e.g., RAM memory, magnetic or optical drive or diskette and the like.

More specifically, the system 500 can be configured to prevent accelerated aging of physically unclonable function of an integrated circuit. Thus, system 500 can be implemented with the necessary hardware and/or software to apply or to prevent accelerated aging of physically unclonable function of an integrated circuit.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for preventing accelerated aging of a physically unclonable function circuit, comprising:
    monitoring, by a processor, an environmental condition associated with the physically unclonable function circuit;
    wherein the environmental condition comprises an operating voltage of the physically unclonable function circuit;
    detecting, by the processor, a change in the environmental condition associated with the physically unclonable function circuit; and
    implementing, by the processor and in response to the change in the environmental condition, a security function for preventing the accelerated aging of the physically unclonable function circuit.

2. The method of claim 1, wherein the monitoring includes monitoring a plurality of environmental conditions, and the plurality of environmental conditions comprises an operating temperature of the physically unclonable function circuit.

3. The method of claim 1, wherein the monitoring includes monitoring a plurality of environmental conditions, and the plurality of environmental conditions comprises a time period in which the physically unclonable function circuit is accessed.

4. The method of claim 1, wherein the security function comprises deactivating the physically unclonable function circuit.

5. The method of claim 1, wherein the security function comprises activating the physically unclonable function circuit for a shorter period of time.

6. The method of claim 1, wherein the security function comprises modifying a challenge of the physically unclonable function circuit.

7. The method of claim 1, wherein the security function comprises limiting access to inputs of the physically unclonable function circuit.

8. The method of claim 1, wherein the security function comprises modifying a number of challenges of the physically unclonable function circuit.

9. The method of claim 1, wherein the security function comprises applying a uniform aging on each path of the physically unclonable function circuit.

10. The method of claim 1, wherein the security function comprises receiving an authentication before providing access to the physically unclonable function circuit.

11. The method of claim 10, wherein the authentication comprises a password.

12. The method of claim 1, wherein the security function comprises controlling a time duration that the physically unclonable function circuit is active.

13. A method for preventing accelerated aging of a physically unclonable function circuit, comprising:
    monitoring, by a processor, a physically unclonable function parameter associated with the physically unclonable function circuit;
    wherein the physically unclonable function parameter comprises a signature of the physically unclonable function circuit;
    detecting, by the processor, a change in the physically unclonable function parameter associated with the physically unclonable function circuit; and
    implementing, by the processor and in response to the change in the physically unclonable function parameter, a security function for preventing the accelerated aging of the physically unclonable function circuit.

14. The method of claim 13, wherein the signature is formulated from a natural frequency of the physically unclonable function circuit.

15. The method of claim 13, wherein the signature is formulated from an energy requirement of the physically unclonable function circuit.

16. The method of claim 15, wherein the energy requirement of the physically unclonable function circuit comprises at least one of: a power requirement, a voltage requirement, or a current requirement.

17. The method of claim 13, wherein the security function comprises deactivating the physically unclonable function circuit.

18. The method of claim 13, wherein the security function comprises activating the physically unclonable function circuit for a shorter period of time.

19. A system for preventing accelerated aging of a physically unclonable function circuit, comprising:
    a computer processor;
    a memory coupled to the computer processor, wherein the memory is configured with instructions that when executed by the computer processor cause the computer processor to:
        monitor an environmental condition associated with the physically unclonable function circuit;
        wherein the environmental condition comprises an operating voltage of the physically unclonable function circuit;
        detect a change in the environmental condition associated with the physically unclonable function circuit; and
        implement in response to the change in the environmental condition, a security function for preventing the accelerated aging of the physically unclonable function circuit.

20. The system of claim 19, wherein the memory is further configured with instructions that, when executed by the computer processor, cause the computer processor to monitor a plurality of environmental conditions, and the plurality of environmental conditions includes a time period in which the physically unclonable function circuit is accessed.

* * * * *